US006596465B1

(12) United States Patent
Mangat et al.

(10) Patent No.: US 6,596,465 B1
(45) Date of Patent: Jul. 22, 2003

(54) METHOD OF MANUFACTURING A SEMICONDUCTOR COMPONENT

(75) Inventors: Pawitter Jit Singh Mangat, Gilbert, AZ (US); James Richard Wasson, Chandler, AZ (US); Scott Daniel Hector, Oakland, CA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/414,735

(22) Filed: Oct. 8, 1999

(51) Int. Cl.$^7$ .............................. G03C 5/00; G03F 9/00
(52) U.S. Cl. .......................... 430/311; 430/5; 430/395; 430/396
(58) Field of Search ............................. 430/5, 322, 323, 430/324, 312, 313, 314, 316, 317, 318, 311, 395, 396; 378/35, 34

(56) References Cited

U.S. PATENT DOCUMENTS

| | | | |
|---|---|---|---|
| 5,052,033 A | 9/1991 | Ikeda et al. | 378/35 |
| 5,190,836 A | 3/1993 | Nakagawa et al. | 430/5 |
| 5,464,711 A | 11/1995 | Mogab et al. | 430/5 |
| 5,503,950 A | 4/1996 | Miyake et al. | 430/5 |
| 5,521,031 A | 5/1996 | Tennant et al. | 430/5 |
| 5,641,593 A | 6/1997 | Watanabe et al. | 430/5 |
| 5,928,817 A | 7/1999 | Yan et al. | 430/5 |
| 5,935,737 A | 8/1999 | Yan | 430/5 |
| 6,178,221 B1 * | 1/2001 | Levinson et al. | 378/35 |

OTHER PUBLICATIONS

A.M. Hawryluk, et al., EUV Reticle Pattern Repair Experiments Using 10 KeV Neon Ions, OSA Proceedings on Extreme Ultraviolet Lithography, 1994, vol. 23, pp. 204–208.

Khanh B. Nguyen, et al., Defects in Coatings Deposited by Planar Magnetron Sputtering: Measurements with a Tencor Surfscan 6200, OSA Proceedings on Extreme Ultraviolet Lithography, 1994, vol. 23, pp. 209–216.

D.R. Kania, et al., Quartz Substrates for EUV Lithography Reticles, OSA Proceedings on Extreme Ultraviolet Lithography, 1994, vol. 23, pp. 217–221.

Paul B. Mirkarimi, Stress, reflectance, and temporal stability of sputter–deposited Mo/Si and Mo/Be multilayer films for extreme ultraviolet lithography, Paper 980417, Published Jan. 21, 1999, Optical Engineering, vol. 38 No. 7, Jul. 1999, pp. 1246–1259.

Andrew M. Hawryluk et al., Repair Of Opaque Defects On Reflection Masks For Soft X–Ray Projection Lithography, 1992 American Vacuum Society, J. Vac. Sci. Technol. B 10(6), Nov./Dec. 1992, pp. 3182–3185.

D.M. Tennant et al., Reflective Mask Technologies And Imaging Results In Soft X–Ray Projection Lithography, 1991 American Vacuum Society, J. Vac. Sci. Technol. B9 (6) Nov./Dec. 1991, pp. 3176–3183.

* cited by examiner

Primary Examiner—Mark F. Huff
Assistant Examiner—Saleha R. Mohamedulla
(74) Attorney, Agent, or Firm—Kim-Marie Vo

(57) ABSTRACT

A method of manufacturing a semiconductor component includes providing a semiconductor substrate (150) with a photoresist layer and providing a reflective lithographic mask (120, 200) having a radiation-absorptive composite layer (270) in a pattern over a radiation-reflective composite layer (220). A radiation sensitive layer is disposed over the semiconductor substrate, and an extreme ultra-violet light (110, 130) reflects a pattern off of the mask and onto the photoresist layer.

18 Claims, 1 Drawing Sheet

METHOD OF MANUFACTURING A SEMICONDUCTOR COMPONENT

BACKGROUND OF THE INVENTION

This invention relates, in general, to electronics and, more particularly, to methods of manufacturing semiconductor components.

Semiconductor devices such as, for example, transistors in semiconductor components are manufactured using lithographic techniques. It is difficult to utilize conventional lithographic techniques to manufacture features with dimensions of less than 180 nanometers (nm). Accordingly, new lithographic techniques have been developed to more reliably manufacture sub-quartermicron features. As an example, Extreme Ultra-Violet Lithography (EUVL) can be used to manufacture features with dimensions of less than approximately 0.25 microns.

EUVL uses extreme ultra-violet radiation having a wavelength in the range of 4 to 25 nm to carry out projection imaging. EUVL masks are reflective in nature and are not transmissive like masks for other lithographic technologies such as conventional optical photolithography, SCattering with Angular Limitation Projection Electron beam Lithography (SCALPEL) or X-Ray Lithography (XRL). EUVL masks comprise a patterned EUV radiation absorber on top of a multi-layered film that is reflective at EUV wavelengths.

Radiation absorbers in EUVL masks have been fabricated using a two-layer process that involves a repair buffer layer of silicon dioxide and a radiation absorbing layer of aluminum-copper, titanium nitride, or the like. One problem with this two-layer process is the difficulty in patterning the repair buffer layer without damaging the underlying reflective multi-layered film. The buffer layer can be patterned with a reactive ion etching technique, but a high etch selectivity to the underlying multi-layered film is difficult to achieve. A wet etch to pattern the buffer layer can result in an undercutting of the buffer layer beneath the patterned absorber layer, and this undercutting produces other problems.

Accordingly, a need exists for an improved method of manufacturing a semiconductor component having submicron features. If an EUVL process is used in the manufacturing method, the EUVL masks should be substantially defect free, and the peak reflectivity and bandpass at the EUV wavelengths should remain unchanged before and after the patterning of the radiation absorbing layer.

Figure 1:
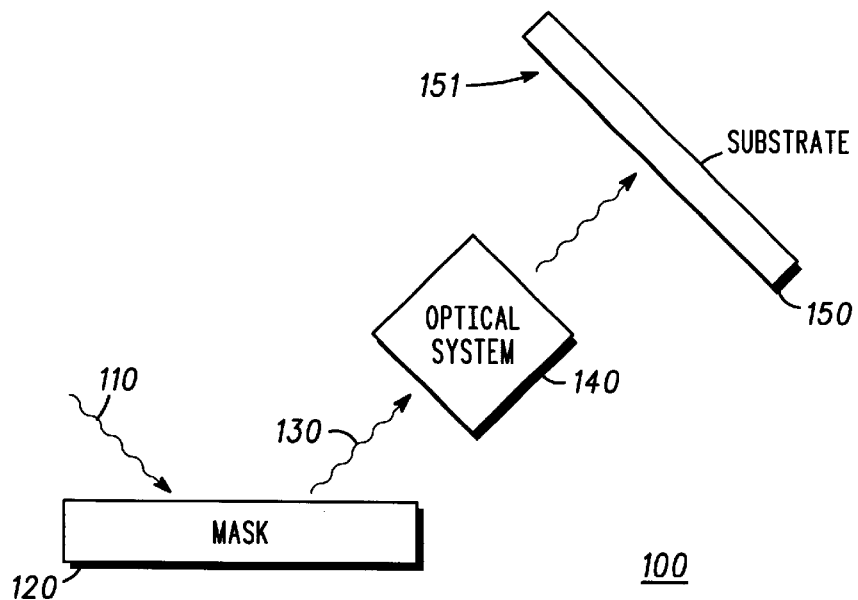
FIG. 1 illustrates a simplified block diagram of an Extreme Ultra-Violet Lithographic (EUVL) projection system used to manufacture a semiconductor component in accordance with an embodiment of the present invention.

The present invention will be better understood from a reading of the following detailed description, taken in conjunction with the accompanying drawing figures. For simplicity and clarity of illustration, elements in the figures are not necessarily drawn to scale, and the same reference numerals in different figures denote the same elements. Additionally, descriptions and details of well-known features and processing techniques are omitted to avoid unnecessarily obscuring the present invention.

DETAILED DESCRIPTION OF THE DRAWINGS

FIG. 1 illustrates a simplified block diagram of an Extreme Ultra-Violet Lithographic (EUVL) projection system or method 100 used to manufacture a semiconductor component 151. System 100 includes transferring a pattern from a lithographic mask 120 to a substrate 150. As used herein, "substrate 150" can include semiconductor, dielectric, metallic, and photoresist layers. Component 151 is formed in substrate 150. In the preferred embodiment, mask 120 includes a light absorbing or radiation blocking layer overlying a light or radiation reflecting layer. Mask 120 is discussed in more detail hereinafter.

To reflect the pattern from mask 120 onto substrate 150, system 100 preferably only uses Extreme Ultra-Violet (EUV) light or radiation having a wavelength of approximately 10–14 nanometers (nm), although wavelengths of between 4 and 30 nm can also be used. As used herein, the terms "light" and "radiation" are used interchangeably. The source EUV radiation is represented by squiggle 110 in FIG. 1, and the reflected EUV radiation is represented by squiggle 130 in FIG. 1. Element 140 in FIG. 1 represents an optical system in the EUVL process. As an example, element 140 can include, among other features, reduction optics and condenser optics. In the preferred embodiment, a layer of photoresist is disposed over substrate 150, and the reflected EUV radiation carrying the pattern reflected off of mask 120 is used to define a pattern in the photoresist layer.

Figure 2:
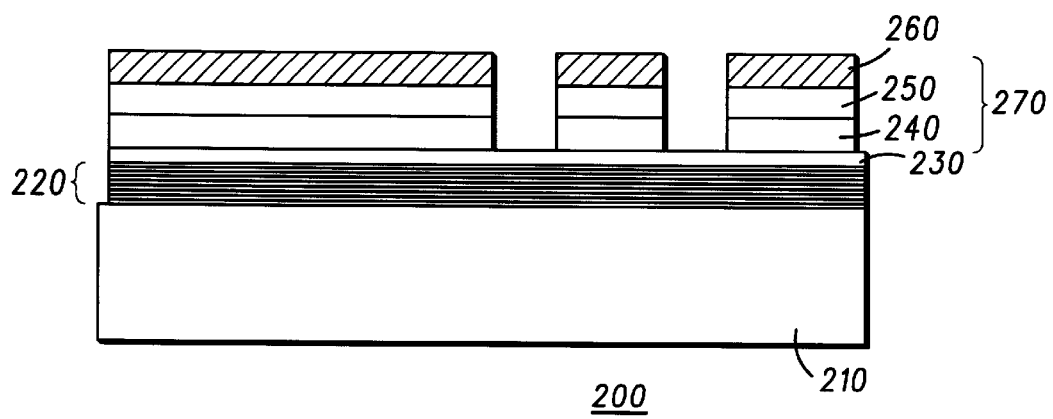
FIG. 2 illustrates a simplified cross-sectional view of an EUVL mask in accordance with an embodiment of the present invention.

FIG. 2 illustrates a cross-sectional view of an EUVL mask 200 that is similar to mask 120 in FIG. 1. Mask 200 includes, among other features, a support substrate 210, a radiation reflective layer 220, a capping layer 230, and a radiation absorbing or blocking layer 270. In an embodiment, substrate 210 is comprised of silicon, low expansion glass, or a similar material with a low coefficient of thermal expansion. Layer 220 is comprised of a material that is capable of reflecting EUV radiation. By way of example, layer 220 is a composite layer comprised of alternating layers of molybdenum (Mo) and silicon (Si), alternating layers of Mo and beryllium (Be), or alternating layers of molybdenum combined with ruthenium (MoRu) and Be. Layer 230 serves as a cap over layer 220. Preferably, layer 230 is comprised of amorphous silicon. Layer 270 is preferably a composite layer comprised of a radiation absorbing or blocking layer 260, a buffer layer 250, and an etch stop layer 240. As illustrated in FIG. 2, layer 240 is located closer to layers 230 and 220 than layer 260, and layer 250 is located between layers 240 and 260.

The specific materials used for layers 240, 250, and 260 should be chemically robust and should be capable of being patterned to have substantially vertical sidewalls. To achieve substantially vertical sidewalls, the materials preferably have an amorphous structure and not a polycrystalline structure. The prior art uses materials such as titanium and aluminum copper that have polycrystalline structures.

Layer 260 is preferably vacuum compatible, stable with EUV radiation, thermally conductive, and have an emissivity substantially matched with layer 220. Furthermore, layer 260 is comprised of a material that is capable of absorbing or blocking EUV radiation such that the EUV radiation absorbed or blocked by layer 260 is not reflected by layer 220. As an example, layer 260 can be comprised of tantalum (Ta), tantalum silicon (TaSi), tantalum nitride (TaN), tantalum silicon nitride (TaSiN), chromium (Cr), chromium nitride (CrN), and chromium oxynitride (CrON). Layer 250 serves as a repair buffer. In a preferred embodiment, layer 250 is comprised of carbon (C) or silicon oxynitride (SiON).

Layer 240 serves as an etch stop to protect the underlying layers 230 and 220 during the patterning of overlying layer 250. Layer 240 is preferably comprised of a material that has high etch selectivity to layers 250 and 260. In the example, if layer 250 is comprised of C, then layer 240 is comprised of Cr, but if layer 250 is comprised of SiON, then layer 240 can be comprised of either Cr or C.

When mask 200 is used in a process to manufacture a semiconductor component, the source radiation is shined or directed towards mask 200. Portions of the radiation will be simultaneously reflected off of layer 220 toward a substrate and absorbed by layer 270. Layer 270 covers portions of layer 220 and prevents the underlying portions of layer 220 from reflecting the radiation by absorbing the radiation.

A method of manufacturing an embodiment of mask 200 is described hereinafter. Experiments have shown that the following manufacturing process can produce an EUVL mask having a peak reflectivity and band pass at the EUV wavelengths that remain substantially unchanged before and after the patterning of the radiation absorbing layer. In fact, experiments have shown a reflectivity loss of less than 2.5 percent (%) after forming the pattern in layers 240, 250, and 260. In this embodiment, layers 260, 250, and 240 are comprised of TaSi or TaSiN, SiON, and Cr, respectively.

Masks can be fabricated using mask blanks covered by multi-layers. To manufacture these blanks, the multi-layers (layer 220) can be deposited on 150 millimeter (mm) or 200 mm diameter Si substrates (substrate 210) or a 6 inch square glass substrate using magnetron or ion-beam sputtering. The multi-layers can be composed of approximately 40–100 layers in approximately 20–80 pairs of Mo and Si with a period of approximately 7 nm. The period was chosen to produce a centroid wavelength of approximately 13.4 nm at approximately 88.8 degrees from the multi-layer surface to match the multi-layers in exposure systems used to evaluate the masks.

In a subtractive process, a three-layer stack of TaSi or TaSiN, SiON, and Cr is deposited on the Mo/Si multi-layers. An advantage of using this stack sequence is the improved selectivity within the films during pattern transfer using high density Electron Cyclotron Resonance (ECR) plasma etching. Furthermore, a Cr etch stop layer (layer 240) can be selectively and anisotropically dry etched without damaging the top Si layer (layer 230) of the multi-layer stack (layer 220). To avoid damaging the multi-layer stack, the wafer temperature during deposition or etching of the three layer stack (layer 270) should not exceed 150 degrees Celsius (° C.).

A thin Cr layer (layer 240) approximately 10 nm thick acts as an etch stop while transferring the pattern through the repair buffer (layer 250). The Cr layer is sputter deposited on top of the surface of the capping-layer (layer 230). SiON (layer 250) is deposited on top of the Cr film using a plasma-enhanced chemical vapor deposition (PECVD) reactor at a deposition temperature of approximately 125° C. to 150° C. SiON films were chosen for use as the repair buffer (layer 250) due to their plasma etch characteristics and selectivity to the underlying Cr etch stop layer (layer 240). As an example, the SiON film can have a thickness of approximately 50–100 nm. An absorber layer (layer 260) of TaSi or TaSiN is sputter deposited on top of the SiON repair buffer (layer 250). TaSi and TaSiN films have good etch selectivity to SiON and are also chemically robust and can withstand harsh chemical treatment during mask cleaning. The TaSi or TaSiN film thicknesses can range from approximately 30–100 nm.

Conventional photolithography and etch process steps are used to pattern the three-layer stack. As an example, a commercial i-line resist process in combination with an i-line stepper can be used to pattern the resist. Since the current microstepper for printing EUVL masks is a 10× reduction system, the lithography resolution and critical dimension (CD) control requirements are not demanding. However, it is desirable to obtain CDs close to coded size on the optical reticle for 0.7 to 1.0 micrometer lines and spaces. Furthermore, it is desirable to pattern the mask with e-beam tools for improved quality of features and follow the 4×-reduction system.

In order to ensure that the TaSi or TaSiN layer (layer 260) etches uniformly across the wafer and that the smallest features are cleared, a short oxygen descum is preferably done prior to pattern transfer. The resist etch rate is about 5 nanometers per minute (nm/min), and the etch time is approximately 1 minute. The TaSi or TaSiN layer can be patterned in an electron cyclotron reactor/reactive ion etch (ECR/RIE) etch tool equipped with a spatial emission end point detection system. Chlorine is used as the etchant gas, and the etch is done at approximately 55° C. using backside helium (He) cooling. A 25% over-etch time is standard.

The SiON layer (layer 250) is subsequently etched in a fluorine-based chemistry. The etch process for this film can provide a nearly vertical sidewall profile. A typical SiON etch rate is 80 nm/min, and the SiON layer is preferably over-etched by 20% past the endpoint, which is clearly defined due to the selectivity of etch to the underlying Cr etch stop film (layer 240). This dry etching process eliminates detrimental undercutting typically observed with a wet process.

Upon completion of pattern transfer into the TaSi or TaSiN layer (layer 260) and the SiON layer (layer 250), the resist is stripped by a 10 minute immersion in a sulfuric acid and hydrogen peroxide solution heated to approximately 85–90° C. A resist ash process, which is typically performed at greater than approximately 150° C., is preferably not used due to the temperature limitations on the multi-layer blanks.

To use focused ion-beam (FIB) repair on the absorber pattern, the resist needs to be removed prior to pattern transfer to the SiON films (layer 250). In that case, the TaSi or TaSiN layer (layer 260) acts as a hard mask to pattern the repair buffer film (layer 250). The Cr layer (layer 240) can be removed either by a wet chemical process or a dry RIE process. A wet process for Cr removal has a small process window, and it also leads to non-uniform etching and adhesion loss of small features. A dry RIE process is more effective in uniform removal of Cr with minimal microloading effects. An RIE process using a chlorine/oxygen chemistry can have good etch selectivity (greater than 5:1) to the top Si layer of the multi-layer stack (layer 220) and will not degrade the TaSi or TaSiN layer (layer 260).

In an embodiment of mask 200 where carbon is used in layers 250 or 240, the carbon film can be deposited using several methods including, but not limited to, sputtering, chemical vapor deposition, evaporation, cathodic vacuum arc, mass selected ion beam deposition, and pulsed laser deposition. These methods can be used to deposit different types of film such as amorphous carbon, amorphous hydrogenated carbon, graphitic carbon, and diamond-like carbon. A carbon EUV repair buffer layer (layer 250) could be deposited by any of the above methods. Also, any of the above types of carbon are applicable as an EUV repair buffer layer (layer 250) or an etch stop type layer (layer 240).

Carbon offers several advantages over silicon dioxide ($SiO_2$) or SiON as an EUV repair buffer layer. For instance, unlike SiO₂ or SiON, which are insulators, carbon is a thermal and electrical conductor, which alleviates concerns over mismatches in the coefficients of thermal expansion between the reflective multi-layers (layer 220) and the absorbing composite layer (layer 270). Carbon can be anisotropically dry etched using low-pressure oxygen in an RIE system with a low-power density of up to approximately 0.5 W/cm². In fact, oxygen pressures up to 15 millitorr (mtorr) can produce nearly vertical sidewalls. A carbon EUV repair buffer (layer 250) permits the elimination of a Cr etch stop layer (layer 240), which is required if SiO₂ or SiON is used as the repair buffer (layer 250). The etch selectivity of C to Si is nearly infinite when using an oxygen plasma. With a nearly infinite etch selectivity, the Cr etch stop (layer 240) can be eliminated, thus simplifying the EUV mask making process. The C layer can be approximately 40–60 nm thick.

When considering the commercially available anisotropic etchants having appropriate etch selectivities and the other considerations mentioned hereinabove, the following combinations of materials for layers 260, 250, and 240 are respectively preferred: TaSi/C/Cr, TaSi/SiON/C, TaSi/SiON/Cr, TaSiN/C/Cr, TaSiN/SiON/C, TaSiN/SiON/Cr, Cr/SiON/C, Cr/SiON/Cr, CrN/SiON/C, CrN/SiON/Cr, CrON/SiON/C, and CrON/SiON/Cr.

Therefore, an improved method of manufacturing a semiconductor component with submicron features is provided to overcome the disadvantages of the prior art. If an EUVL process is used in the manufacturing method, the EUVL masks can be substantially defect free, and the peak reflectivity and bandpass at the EUV wavelengths can remain unchanged before and after the patterning of the radiation absorbing layer.

All of the disclosed embodiments of the present invention described herein are enabled and can be realized and practiced without undue experimentation. Although the best mode of carrying out the present invention contemplated by the inventors is disclosed hereinabove, practice of the present invention is not limited thereto. Furthermore, while the present invention has been particularly shown and described mainly with reference to preferred embodiments, it will be understood by those skilled in the art that changes in form and detail may be made to the disclosure herein without departing from the spirit and scope of the present invention. For instance, the numerous details set forth herein such as, for example, the material compositions, the layer thicknesses, and the deposition and etching conditions are provided to facilitate the understanding of the present invention and are not provided to limit the scope of the present invention.

Accordingly, the disclosure of the present invention is not intended to be limiting. Instead, the disclosure of the present invention is intended to be illustrative of the scope of the present invention, which is set forth in the following claims. The appended claims are not to be interpreted as including means-plus-function limitations, unless such a limitation is expressly recited in a given claim using the phrase "means for".

What is claimed is:

1. A method of manufacturing a semiconductor component comprising:
   providing a lithographic mask having an absorptive composite layer comprised of at least three patterned layers, wherein the at least three patterned layers comprise:
   an etch stop layer;
   a buffer layer over the etch stop layer; and
   an absorptive layer over the buffer layer;
   providing a substrate; and
   transferring a pattern from the lithographic mask to the substrate.

2. The method of claim 1 wherein transferring the pattern further comprises reflecting the pattern from the lithographic mask to the substrate.

3. The method of claim 1 wherein transferring the pattern further comprises using an extreme ultra-violet light to transfer the pattern from the lithographic mask to the substrate.

4. The method of claim 1 wherein transferring the pattern further comprises using a light having a wavelength of approximately 4–25 nanometers to transfer the pattern from the lithographic mask to the substrate.

5. The method of claim 1 wherein providing the lithographic mask further comprises providing a reflective multilayer structure underneath the absorptive composite layer.

6. The method of claim 5 wherein transferring the pattern further comprises:
   shining a light towards the lithographic mask; and
   reflecting the light off of the reflective multilayer structure towards the substrate while using the absorptive composite layer to absorb the light and to prevent reflecting the light off of the absorptive composite layer.

7. The method of claim 6 wherein shining the light further comprises providing the light with a wavelength of approximately 4 to 25 nanometers.

8. The method of claim 5 wherein providing the lithographic mask further comprises providing a material selected from the group consisting of chromium and carbon for a first one of the at least three patterned layers.

9. The method of claim 8 wherein providing the lithographic mask further comprises providing a material having an element selected from the group consisting of tantalum and chromium for a second one of the at least three patterned layers, wherein the first one of the at least three patterned layers is closer to the reflective multilayer structure than the second one of the at least three patterned layers.

10. The method of claim 9 wherein providing the lithographic mask further comprises providing a material selected from the group consisting of carbon and silicon oxynitride for a third one of the at least three patterned layers, wherein the third one of the at least three patterned layers is located between the first and second ones of the at least three patterned layers.

11. The method of claim 1 wherein providing the lithographic mask further comprises providing a radiation blocking layer, a buffer layer, and an etch stop layer for the at least three patterned layers, wherein the radiation blocking layer overlies the buffer layer, and wherein the buffer layer overlies the etch stop layer.

12. The method of claim 11 wherein transferring the pattern further comprises:
   using ultra-violet radiation to reflect the pattern off of the lithographic mask to the substrate; and
   using the radiation blocking layer to absorb the ultra-violet radiation to prevent reflecting the ultra-violet radiation from the radiation blocking layer.

13. The method of claim 12 wherein providing the radiation blocking layer further comprises providing a material having an amorphous crystalline structure for the radiation blocking layer.

14. A method of manufacturing a semiconductor component comprising:
  providing a lithographic mask comprising:
    a support substrate;
    a reflective composite layer over the support substrate, wherein the reflective composite layer comprises a first plurality of layers comprised of molybdenum separated by a second plurality of layers comprised of a material selected from the group consisting of silicon and beryllium;
    an absorptive composite layer forming a pattern over the reflective composite layer, wherein a portion of the reflective composite layer is exposed by the pattern of the absorptive composite layer and wherein the absorptive composite layer comprises at least three patterned layers, wherein the at least three patterned layers comprise:
      an etch stop layer;
      a buffer layer over the etch stop layer; and
      an absorptive layer over the buffer layer;
  providing a semiconductor substrate;
  disposing a photoresist layer over the semiconductor substrate; and
  using extreme ultra-violet light to reflect the pattern from the lithographic mask onto the photoresist layer.

15. The method of claim 14 wherein providing the lithographic mask further comprises providing a material having an element selected from the group consisting of tantalum and chromium for a first one of the at least three patterned layers.

16. The method of claim 15 wherein providing the lithographic mask further comprises providing a material selected from the group consisting of chromium and carbon for a second one of the at least three patterned layers, wherein the second one of the at least three patterned layers is closer to the reflective composite layer than the first one of the at least three patterned layers.

17. The method of claim 16 wherein providing the lithographic mask further comprises providing a material selected from the group consisting of carbon and silicon oxynitride for a third one of the at least three patterned layers, wherein the third one of the at least three patterned layers is located between the first and second ones of the at least three patterned layers.

18. The method of claim 14 wherein providing the lithographic mask further comprises providing an amorphous silicon layer between the reflective composite layer and the absorptive composite layer.

* * * * *